United States Patent
Rantakari

(10) Patent No.: US 6,242,732 B1
(45) Date of Patent: Jun. 5, 2001

(54) OPTICAL RECEIVER WITH A CONTROL LOOP PROVIDING WIDE DYNAMIC RANGE

(75) Inventor: Erkki Rantakari, Helsinki (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/566,899

(22) Filed: May 8, 2000

Related U.S. Application Data

(63) Continuation of application No. PCT/FI98/00890, filed on Nov. 13, 1998.

(30) Foreign Application Priority Data

Nov. 13, 1997 (FI) ........................................................ 974225

(51) Int. Cl.[7] .................................................... H01J 40/14
(52) U.S. Cl. ...................... 250/214 A; 330/308; 327/514
(58) Field of Search .......................... 250/214 A, 214 LA, 250/214 AG, 214 R, 214 C; 330/110, 308, 259, 59; 327/514, 563, 103; 359/110, 189, 194

(56) References Cited

U.S. PATENT DOCUMENTS

| | | |
|---|---|---|
| 4,415,803 | 11/1983 | Muoi . |
| 5,030,925 * | 7/1991 | Taylor .............................. 250/214 A |
| 5,606,277 * | 2/1997 | Feliz ................................ 250/214 LA |

FOREIGN PATENT DOCUMENTS

| | | |
|---|---|---|
| 42 12 934 | 10/1993 | (DE) . |
| 44 03 985 | 8/1995 | (DE) . |
| 0 451 748 | 10/1991 | (EP) . |
| 0 514 592 | 11/1992 | (EP) . |
| 0 666 657 | 8/1995 | (EP) . |
| 2 247 798 | 3/1992 | (GB) . |

OTHER PUBLICATIONS

May 1999, International Search Report for PCT/FI98/00890.

* cited by examiner

*Primary Examiner*—John R. Lee
*Assistant Examiner*—Kevin Pyo
(74) *Attorney, Agent, or Firm*—Altera Law Group, LLC

(57) ABSTRACT

The invention relates to an optical receiver comprising a transimpedance amplifier (21) and a photo detector (PD) for converting the optical power arriving at the receiver into electric current. To enable a good dynamic range to be achieved for the receiver in a simple way, the transimpedance amplifier is a differential amplifier provided with two inputs. Furthermore, the receiver comprises separating means (LPU) for separating a direct voltage component from the output voltage of the transimpedance amplifier and means (VCU) for supplying a direct voltage dependent on the direct current component to that input of the transimpedance amplifier which is different from the input used by the photo detector.

4 Claims, 2 Drawing Sheets

OPTICAL RECEIVER WITH A CONTROL LOOP PROVIDING WIDE DYNAMIC RANGE

This application is a continuation of international application serial number PCT/FI980/00890, filed Nov. 13, 1998.

FIELD OF THE INVENTION

The invention relates generally to an optical receiver. More specifically, the invention relates to a control loop to be used in an optical receiver, wherewith the dynamic range of the input amplifier is widened.

BACKGROUND OF THE INVENTION

An optical transmission system comprises an optical transmitter converting an electrical signal to be transmitted into optical form, (b) an optical fibre serving as a conductor for the optical signal, and (c) an optical receiver detecting the transmitted optical signal and converting it into electrical form.

A typical optical receiver comprises a photo detector connected to the input of a transimpedance amplifier. The photo detector converts the optical signal it has received into electric current that is supplied to the transimpedance amplifier. The latter generates at its output a voltage proportional to the incoming current, and thus a voltage proportional to the current of the photo detector is obtained from the output of the amplifier. The photo detector is usually either an avalanche photo diode (APD) or an optical PIN diode. Avalanche photo diodes are typically used at shorter wavelengths and optical PIN diodes at longer wavelengths, at which avalanche photo diodes generate a considerable quantity of noise. Transimpedance amplifiers are used for example for the reason that they allow comparatively good sensitivity properties to be achieved with a relatively simple construction.

Notwithstanding transimpedance amplifiers, one problem in optical receiver solutions lies in their poor dynamics: good sensitivity often entails a poor power tolerance and a good power tolerance again poor sensitivity. Poor dynamics for their part impair the operational flexibility of the receiver; for example when beginning to use a shorter fibre, an extra attenuator is necessary between the transmitter and the receiver.

Since the power level of the optical signal arriving at the receiver can in practice vary a great deal (depending on how long fibre is used), automatic gain control (AGC) is typically used in connection with the transimpedance amplifier to keep the amplifier's output voltage essentially at a constant value, when the incoming signal is higher than a predetermined threshold value.

There are in practice two different principles for widening the dynamic range of the receiver.

The first way of increasing dynamics is to adjust the resistance of the feedback resistor of the transimpedance amplifier on the basis of the amplitude of the incoming signal. The drawback of this method is that the adjustment generates large parasitics at the input of the amplifier, which will again impair the sensitivity of the receiver. The impairment is particularly marked when discrete components are used. When good sensitivity is aimed at, the stray capacitances on the input point of the amplifier are significant; even a small capacitance will impair the sensitivity of the receiver. Hence, it is essential that the parasitics on the input of the amplifier can be minimized.

Another way to widen the dynamic range is to use an adjustable resistive element in front of the amplifier. The resistance of the element is adjusted in response to the strength of the signal arriving at the amplifier in such a way that at higher levels the resistance is diminished, as a result of which the current coupled to the input of the amplifier will diminish (part of the current passes through the resistive element) and the amplifier is not saturated. This basic solution is known in several different variations. The main drawbacks of these solutions include complex implementation and stray capacitances generated by the requisite additional components, which will impair the sensitivity of the receiver.

SUMMARY OF THE INVENTION

It is an object of the invention to eliminate the drawbacks described above and to provide a solution wherewith the dynamic range of the receiver can be widened in such a way that the circuit solution will remain as simple as possible and furthermore in such a way that impairment of receiver sensitivity is minimal.

This object is achieved with the solution defined in the independent claims.

The idea of the invention is to use a differential input stage in the transimpedance receiver and to reflect the direct voltage dependent on the optical signal input power onto the input of said input stage (instead of its output), thus enabling the linear dynamic range of the output of the transimpedance amplifier to be increased correspondingly.

The solution in accordance with the invention offers a very simple way of increasing the dynamics without any appreciable impairment in the sensitivity of the receiver.

An additional advantage of the solution in accordance with the invention is that conventional inexpensive components can be used in the circuitry, as the solution does not require any peak-value detecting circuits, for example, whose implementation at high frequencies requires special components.

BRIEF DESCRIPTION OF THE DRAWINGS

In the following, the invention and its preferred embodiments will be described in closer detail by way of example with reference to FIGS. 1–4 in the accompanying drawings, in which.

DETAILED DESCRIPTION OF THE INVENTION

Figure 1:
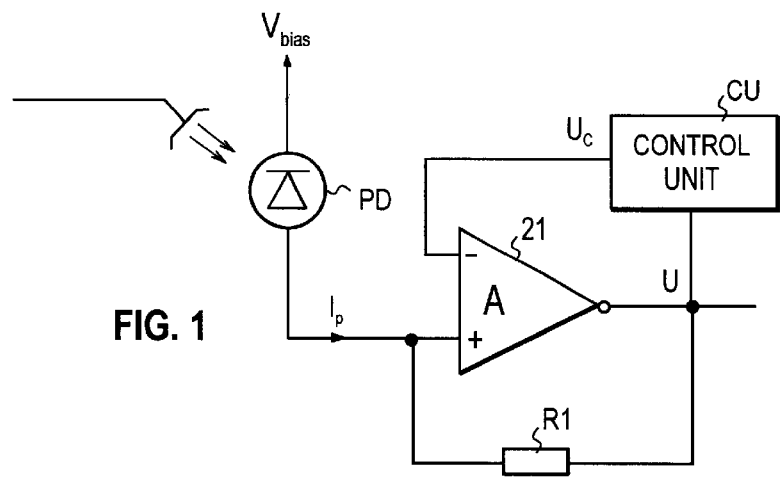
FIG. 1 illustrates a solution in accordance with the invention on a general level.

FIG. 1 illustrates the principle of the invention. In this case, the transimpedance amplifier is comprised of a differential amplifier 21, between the output (which in this exemplary case is inverting) and first (non-inverting) input of which a feedback resistor R1 is connected. The incoming optical signal is converted into a current in a detector PD, whose cathode is connected to a biasing voltage $V_{bias}$ and whose anode is connected to said first input of the differential amplifier 21. A control unit CU separates the direct voltage component from the output voltage U of the transimpedance amplifier and reflects a direct voltage $U_c$ proportional thereto onto the second (inverting) input of the amplifier.

The current $I_p$ generated by the photo detector PD can be expressed as follows:

$$I_p = I_{dc} + I_{ac},$$

where $I_{DC}$ is the direct current component and $I_{AC}$ the alternating current component.

Since in practice optical transmission systems utilize a balanced line code, $I_{DC}$ is approximately half of the peak value of the current. The control unit CU makes use of this characteristic by reflecting a voltage that is proportional to the direct voltage component on the output of the input amplifier onto the second input of the input amplifier, said direct voltage component being caused by said direct current component. As a result of this, the dynamic range of the output voltage of the amplifier is widened.

Figure 2:
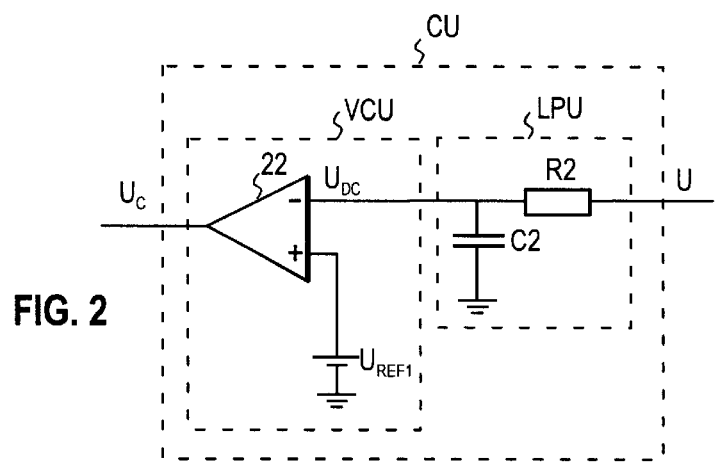
FIG. 2 illustrates the control unit shown in FIG. 1 as a functional block diagram.

FIG. 2 illustrates schematically the configuration of the control unit. The control unit firstly comprises a low-pass unit LPU separating the direct voltage component $U_{DC}$ from the output voltage U of the amplifier 21. In the figure, this low-pass unit is represented by a low-pass filter constituted by resistor R2 and capacitor C2, but said operation can naturally be realized with different circuit solutions. The low-pass unit is followed by a control unit VCU, which increases the input voltage level of the amplifier 21 in such a way that the output voltage of the amplifier is not saturated. The direct voltage component obtained from the output of the low-pass unit, being proportional to the direct current component from the photo detector, is supplied to the first (inverting) input of the differential amplifier 22. A reference voltage $U_{REF1}$, which determines the direct voltage level in the output voltage of amplifier 21, is coupled to the second (non-inverted) input of the differential amplifier. The output of the differential amplifier 22 is coupled to the second input of the transimpedance amplifier 21.

If the control loop is not operative, the direct voltage component $U_{DC}$ diminishes as the input power increases, since the voltage over the feedback resistor R1 increases as the optical input power increases (and since the direct voltage level at the first input of amplifier 21 does not change). Thus, without adjustment the output voltage will become saturated quite rapidly, as the diminishing direct voltage component rapidly diminishes the useful operating range of the output voltage of the amplifier.

On account of the control loop in accordance with the invention, the output voltage of amplifier 22 increases as the direct voltage component $U_{DC}$ diminishes, thus increasing the DC voltage level on the second (inverted) input of the transimpedance amplifier. Hence, in the exemplary case shown in FIGS. 1 and 2 the DC voltage level at the second input of the transimpedance amplifier 21 is changed in inverse proportion to the change in the direct voltage component $U_{DC}$. In such a situation, the direct voltage level on the first input of the differential amplifier will also increase, since on account of the high gain of the differential amplifier the voltage at both inputs is always nearly the same. Since the direct voltage level on the input increases, the direct voltage level on the output need not diminish when the DC component over the feedback resistor R1 changes. In other words, the direct voltage component on the output of the amplifier need not compensate for any change in the received signal power level.

Without the control loop, the voltage on the output should thus decrease on account of both the DC component and the signal component. By means of the control loop in accordance with the invention, the effect of a change in the DC component over the feedback resistor (R1) of the transimpedance amplifier is eliminated by changing the direct voltage level on the input of the amplifier. This will result in an increase in the operational range of the output voltage, and the output of the amplifier will not become saturated as easily. The control loop adjusts the direct voltage level on the output of the amplifier to have the magnitude of the reference voltage $U_{REF1}$.

In practice, since the magnitude of the direct current component in the input signal is about half of the peak value and since the proportion of the direct current component can be compensated for at the input of the transimpedance amplifier, the useful operative range of the output of the amplifier will be approximately doubled with the control loop in accordance with the invention.

Figure 3:
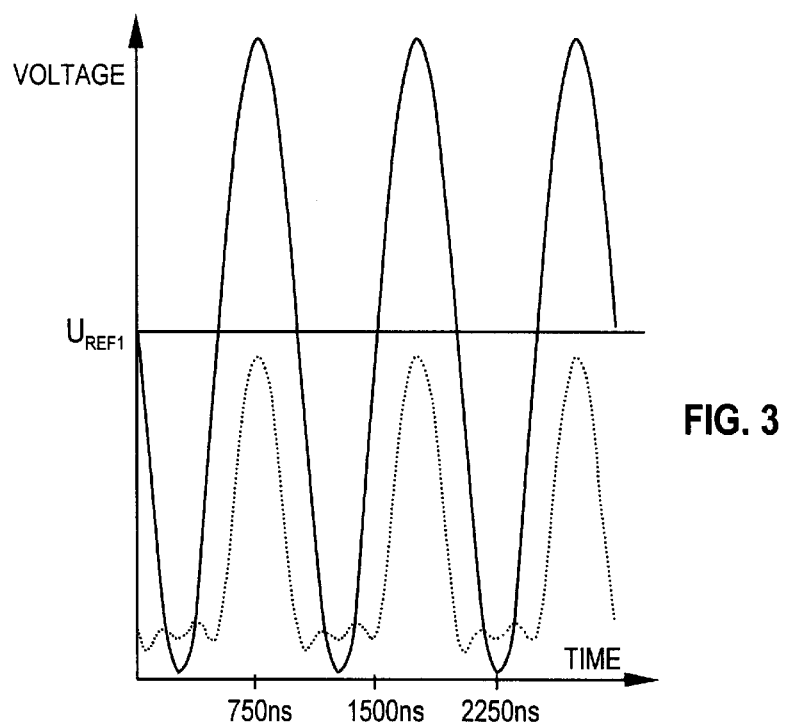
FIG. 3 illustrates the effect of the solution of the invention on the operation of the input stage of the receiver.

FIG. 3 illustrates the effect of the control loop in accordance with the invention in a practically implemented circuit. The figure illustrates the output voltage U of the transimpedance amplifier as a function of time in two different situations. A broken line denotes the output voltage when the control loop is not operative (in which case there is a constant voltage on the second input of the differential amplifier 21), and a continuous line denotes the output voltage when the control loop is operative. As will be seen from the figure, without the control loop the output voltage becomes seriously saturated and the receiver does not operate correctly. When the control loop is operative, the voltage level on the input terminals of the amplifier has increased to the level of the reference voltage $U_{REF1}$, and thus the output of the amplifier will not become saturated and the amplifier operates correctly. The example of FIG. 3 is a simulation result from a practical circuit in which the amplitude of the input current obtained from the photo detector from peak to peak is 60 $\mu$A and the frequency 1 MHz.

Figure 4:
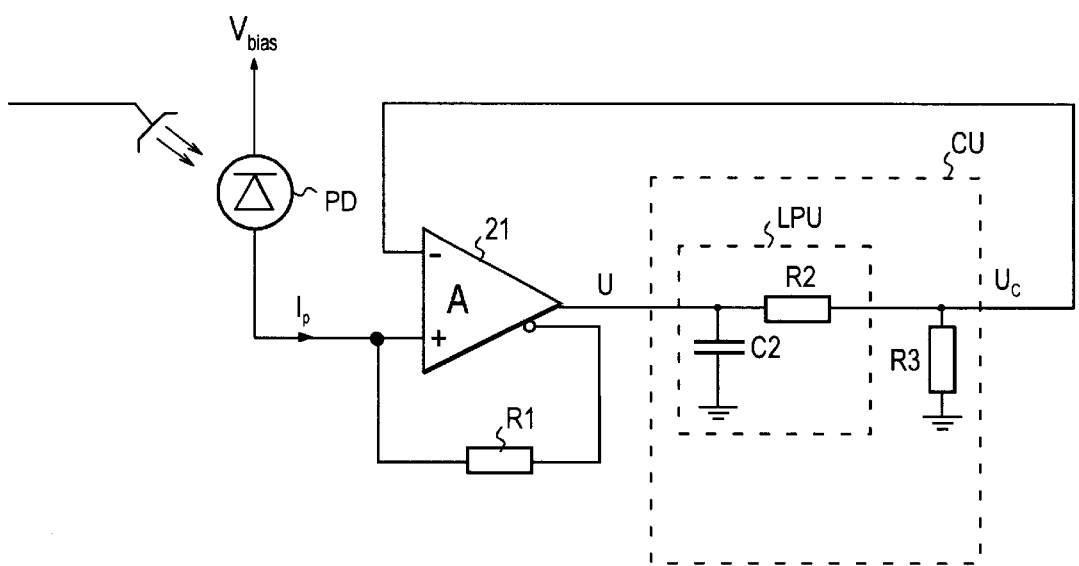
FIG. 4 shows an alternative embodiment of the control unit.

The interdependence of the direct voltage component on the output and the direct voltage component reflected onto the input of the amplifier may vary (for example the proportionality coefficient may vary), as long as the operation is as described above. This can be implemented with a control unit shown in FIG. 4, in which a voltage dividing resistor R3 is incorporated into the output of the low-pass unit. The proportionality coefficient is adjusted in this case by means of the relation of resistors R2 and R3. In such a situation, the control voltage of the control unit must be taken from the second, non-inverted output of the differential amplifier 21 in order for voltage $U_c$ to increase as voltage U decreases (in practice, also the output stage of a differential amplifier is differential).

Even though the invention has been described in the foregoing with reference to examples in accordance with the accompanying drawings, it is obvious that the invention is not limited thereto, but it can be modified within the scope of the inventive idea set forth in the appended claims. The above is a simplified description of the solution in accordance with the invention. In practice, the circuit solutions realizing an equivalent functionality may vary in many ways. For example, the terminals of the transimpedance amplifier may be exchanged; in such a case, the output is not inverting (as in FIG. 1 above).

What is claimed is:

1. A method for controlling an optical receiver, said receiver comprising a transimpedance amplifier (21) and a photo detector (PD) for converting optical power arriving at the receiver into electric current, in accordance with which method a differential amplifier (21) having two inputs is used as the transimpedance amplifier, the output of the photo detector being operationally connected to one of the inputs of the transimpedance amplifier, and a direct voltage component is separated from an output voltage of the amplifier, characterized in that the input of the transimpedance amplifier which is different from the input used by the photo detector is controlled on the basis of the separated direct voltage component in such a way that a direct voltage level at said input changes in response to a change in said direct voltage component.

2. An optical receiver, comprising a differential transimpedance amplifier (21) having two inputs and an output, said output having a direct voltage component, a photo detector (PD) for converting optical power arriving at the receiver into electric current, the output of said photo detector being operationally connected to one of the inputs of the transimpedance amplifier, and separating means (LPU) for separating the direct voltage component from the output of the transimpedance amplifier, characterized in that the receiver further comprises means (VCU; R2, R3) for supplying a direct voltage dependent on said direct voltage component to that input of the transimpedance amplifier which is different from the input used by the photo detector.

3. A receiver as claimed in claim 2, characterized in that said means comprise a differential amplifier (22) to whose first input said direct voltage component is connected and to whose second input a reference voltage is connected and whose output is operationally connected to said different input of the transimpedance amplifier.

4. A receiver as claimed in claim 2, characterized in that the separating means comprise a passive low-pass filter.

* * * * *